(12) United States Patent
Klapproth

(10) Patent No.: US 6,580,288 B1
(45) Date of Patent: Jun. 17, 2003

(54) MULTI-PROPERTY MICROPROCESSOR WITH NO ADDITIONAL LOGIC OVERHEAD TO SHARED PINS

(75) Inventor: Kenneth Douglas Klapproth, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/392,837

(22) Filed: Sep. 9, 1999

(51) Int. Cl.[7] .................................... H03K 19/173
(52) U.S. Cl. ......................... 326/38; 710/12; 710/52; 712/38
(58) Field of Search ......................... 326/38, 39, 41, 326/47; 712/38; 375/219; 710/3, 12, 52

(56) References Cited

U.S. PATENT DOCUMENTS

| | | | | |
|---|---|---|---|---|
| 4,734,885 A | * | 3/1988 | Luich | 365/94 |
| 5,248,908 A | * | 9/1993 | Kimura | 307/465 |
| 5,432,465 A | * | 7/1995 | Hsi-Jung et al. | 326/38 |
| 5,469,473 A | * | 11/1995 | McClear et al. | 375/219 |
| 5,500,611 A | * | 3/1996 | Popat et al. | 326/87 |
| 5,521,531 A | * | 5/1996 | Okuzumi | 326/81 |
| 5,594,367 A | * | 1/1997 | Trimberger et al. | 326/41 |
| 5,652,904 A | * | 7/1997 | Trimberger | 712/38 |
| 5,944,813 A | * | 8/1999 | Trimberger | 712/36 |

* cited by examiner

Primary Examiner—Daniel Chang
(74) Attorney, Agent, or Firm—Thomas E. Tyson; Edmond A. DeFrank

(57) ABSTRACT

The present invention is embodied in a system and method for sharing input and output pins between a plurality of separate logic circuits coexisting within a single microprocessor such that the microprocessor is capable of assuming the characteristics of a desired logic circuit. The present invention achieves controlled sharing of bidirectional input and output pins without the requirement to use multiplexing logic. Because the pins may be shared among a plurality of logic circuits, a single microchip may be used for completely different purposes by enabling or disabling selected logic circuits. In other words, a single microchip can take on any number of properties by simply enabling one or more logic circuits while disabling other.

26 Claims, 4 Drawing Sheets

MULTI-PROPERTY MICROPROCESSOR WITH NO ADDITIONAL LOGIC OVERHEAD TO SHARED PINS

BACKGROUND OF THE INVENTION

1. Field of the invention

The present invention relates to a system and method for implementing a plurality of logic functions on a single microchip, and in particular to an implementation of separate logic circuits on a single microchip wherein the separate logic circuits share input and output pins without the use of multiplexing logic such that the microprocessor is capable of assuming the properties of the desired logic function.

2. Description of the Related Art

Microprocessors commonly use multiple logic circuits to perform a variety of tasks. Feature sizes are constantly getting smaller and smaller, thereby allowing more and more logic elements to be implemented on a silicon wafer, or the equivalent, of a given size. However, the need to provide external interfaces to the microprocessor via input and output pins is a constraint on the lower limit of microprocessor size. Many complicated logic circuits are "pin-intensive," requiring large numbers of input and/or output pins, easily numbering in the hundreds or more. Consequently, as more and more logic circuits are implemented within a single microprocessor, there is an increased need to reduce the pin count, and thus reduce the size of the microprocessor packaging. Towards this end, multiplexing logic is commonly used to multiplex signals to or from the input/output pins from one or more of the logic circuits within the microprocessor.

One problem with multiplexing logic is that the depth of the structure of the logic gates required to implement a traditional on-chip multiplexer increases with each input or output pin being multiplexed. In other words, the number of layers of multiplexing logic increases in proportion to the number of pins being multiplexed. In addition, the multiplexer logic draws power like any other logic circuit. Further, it can take multiple clock cycles to multiplex numerous inputs and outputs. Consequently, microchip power consumption and performance characteristics are degraded by the use of multiplexing logic. Therefore, what is needed is a system and method for allowing the sharing of input and output pins among a plurality of logic circuits without the need to use additional multiplexing logic.

SUMMARY OF THE INVENTION

To overcome the limitations in the related art described above, and to overcome other limitations that will become apparent upon reading and understanding the present application, the present invention is embodied in a system and method for sharing input and output pins between a plurality of separate logic circuits coexisting within a single microprocessor such that the microprocessor is capable of assuming the properties of one or more desired logic circuits.

The system and method of the present invention achieves controlled sharing of input and output pins without the requirement to use multiplexing logic. Further, each of the shared pins within the microprocessor is preferably bi-directional, such that they may be used as either input or output pins for one or more of the plurality of logic circuits within the microprocessor. Because the pins may be shared among a plurality of logic circuits, a single microchip may be used for completely different purposes by enabling or disabling selected logic circuits. In other words, a single microchip can take on any number of properties by simply enabling one or more logic circuits while disabling others.

Because the number of logic gates possible within a single microprocessor has increased exponentially over the years, large numbers of separate logic circuits may be designed into a single microprocessor without a significant increase in cost. Such a design allows for a reduction in the number of unique parts in a system, with a corresponding reduction in system cost.

In general, one or more logic circuits are enabled by a control signal. Inverting the enabling control signal preferably disables logic circuits using the same pins as the enabled circuit or circuits. In this manner, interference between logic circuits is avoided. In addition, because unused logic circuits are preferably disabled, the power requirements of a multi-circuit processor designed in accordance with the present invention are reduced. Further, since the need for multiplexing logic required to address one of a plurality of logic circuits from a single pin has been eliminated, the performance of enabled logic circuits is substantially increased over comparable logic circuits that use multiplexing logic to arbitrate between various logic circuits.

Specifically, the present invention uses a series of latches or logic gates, such as, for example a tri-state driver paired with a receiver device, or the equivalent, to enable or disable specific logic circuits. Further, because each of the shared pins is preferably implemented as a bi-directional signal, the same tri-state driver/receiver preferably allows specific pins to be used as either an input or an output pin. One tri-state driver/receiver is preferably used for each shared pin. A single control signal is input either directly or via an inverter to each of the tri-state drivers/receivers to enable or disable specific logic circuits, and to allow shared pins to act as either an input or an output for the desired logic circuit.

For example, the memory subsystem in a computer may use separate logic circuits to provide an address status and an address response function. Typically these functions are implemented on separate microprocessor chips because they are both pin-intensive, and require very fast performance. Implementing both functions on a single microprocessor using unique pins is possible, but the increase in size required to house the necessary pins reduces the utility of such a configuration. Further, the use of multiplexing logic to reduce the number of pins is undesirable in such a case because the performance of such functions would be substantially degraded by the use of multiplexing logic. However, a multi-property microprocessor designed in accordance with the present invention could act as either an address status or an address response collection unit by simply enabling either of the two logic circuits while disabling the other. Such a microprocessor would allow the use of two identical parts, either of which could take on the properties of the desired function, thereby reducing system cost when compared to an equivalent implementation that uses two unique parts.

The foregoing and other objects, features and advantages of the invention will be apparent from the following more particular description of a preferred embodiment of the invention, as illustrated in the accompanying drawings wherein like reference numbers represent like parts of the invention.

BRIEF DESCRIPTION OF THE DRAWINGS

Referring now to the drawings in which like reference numbers represent corresponding parts throughout.

DETAILED DESCRIPTION OF THE INVENTION

In the following description of the invention, reference is made to the accompanying drawings, which form a part hereof, and in which is shown by way of illustration a specific example in which the invention may be practiced. It is to be understood that other embodiments may be utilized and structural changes may be made without departing from the scope of the present invention.

Introduction

The present invention is embodied in a system and method for sharing input and output pins among a plurality of separate logic circuits coexisting within a single microprocessor without the need to use multiplexing logic for pin sharing. Each of the logic circuits may be individually enabled or disabled by one or more control signals addressing tri-state drivers paired with receiver devices for each shared pin such that the microprocessor is capable of assuming the properties or characteristics of a desired logic circuit. Further, each of the shared pins within the microprocessor is preferably bidirectional, such that they may be used as either input or output pins for one or more of the logic circuits within the microprocessor. In addition, logic circuits using shared pins can coexist in a single microprocessor with other logic circuits that do not share pins.

Each of the shared pins preferably acts as either an input or an output to either address, or be addressed by, one logic circuit at any given time. Because the bidirectional pins may be shared among the logic circuits, a single microchip may be used for completely different purposes by enabling or disabling selected logic circuits. In other words, a single microchip can take on any number of properties by simply enabling one or more logic circuits while disabling others.

Figure 1:
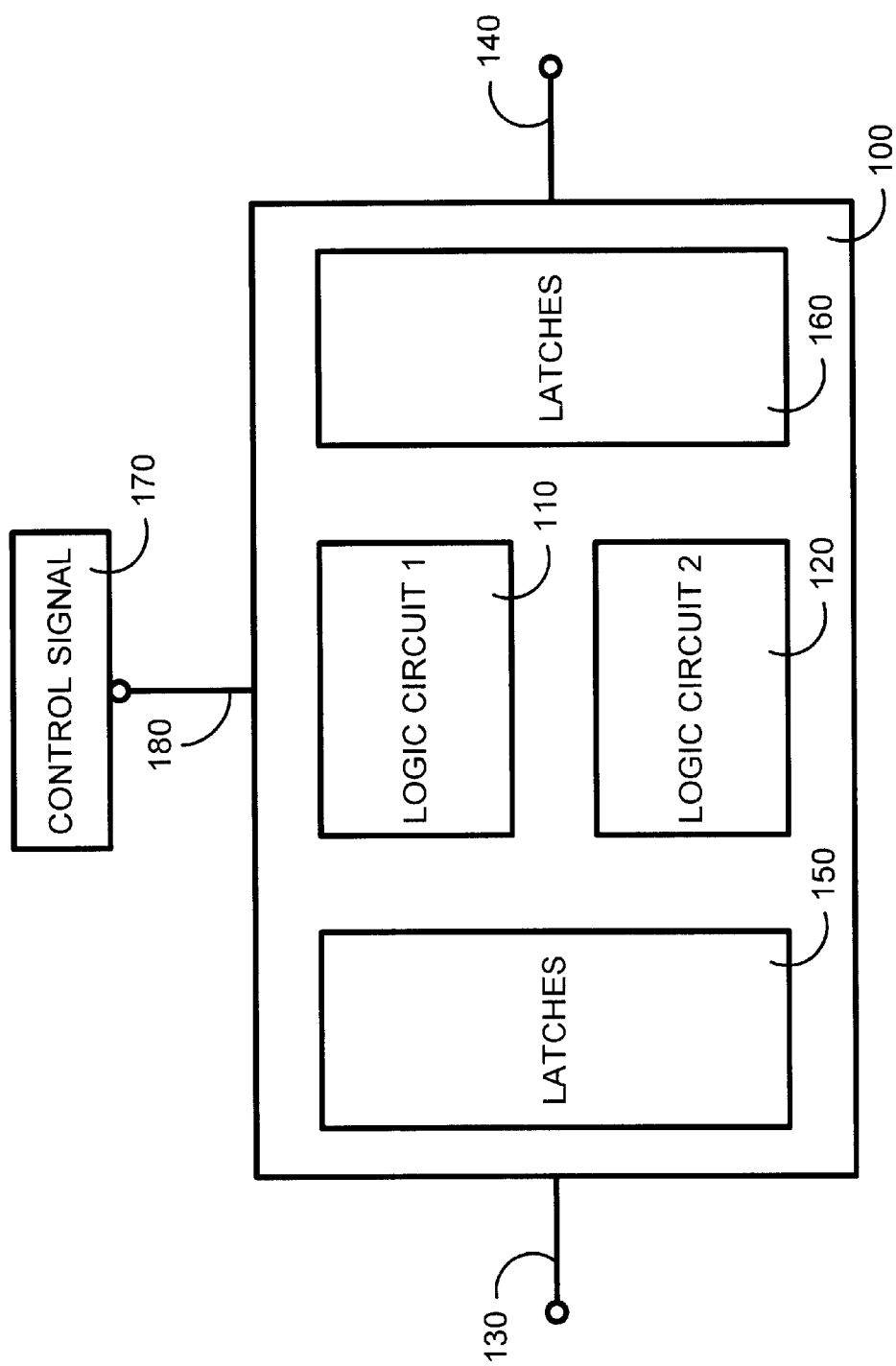
FIG. 1 is a general block diagram illustrating a microprocessor having two independent logic circuits in accordance with the present invention.

System Overview:

FIG. 1 is a general block diagram illustrating a microprocessor 100 having two independent logic circuits, 110 and 120, in accordance with the present invention. The microprocessor 100 has at least two bidirectional input/output pins 130 and 140, such that the microprocessor has at least one input and one output. A series of latches or logic gates, such as, for example a tri-state driver paired with a receiver device, or the equivalent, 150 and 160 are associated with each bi-directional pin.

A control signal 170 is preferably used to enable one logic circuit while disabling the other. The control signal 170 is preferably either a logical "1" or a logical "0" (i.e. either "high" or "low"). A "high" control signal 170 is preferably input to the tri-state drivers/receivers 150 via a control pin 180 to enable the first logic circuit 110. This "high" control signal 170 is preferably inverted and input to the tristate drivers/receivers 160 to disable the second logic circuit 120. Conversely, a "low" control signal 170 is preferably input to the tri-state drivers/receivers 150 via the control pin 180 to disable the first logic circuit 110. This "low" control signal 170 is preferably inverted and input to the tri-state drivers/receivers 160 to enable the second logic circuit 120.

In the case where the first logic circuit 110 is enabled while the second logic circuit 120 is disabled, the microprocessor 100 will appear to an external interface to be comprised of only the first logic circuit 110. Conversely, in the case where the second logic circuit 120 is enabled while the first logic circuit 110 is disabled, the microprocessor 100 will appear to an external interface to be comprised of only the second logic circuit. In use, microprocessor 100 may be cycled between logic circuits by cycling the control signal 170, or may simply be assigned a "permanent" logic circuit by maintaining a constant control signal. In other words, the microprocessor 100 can assume the desired properties by simply ordering the desired behavior via the control pin 180.

Figure 2:
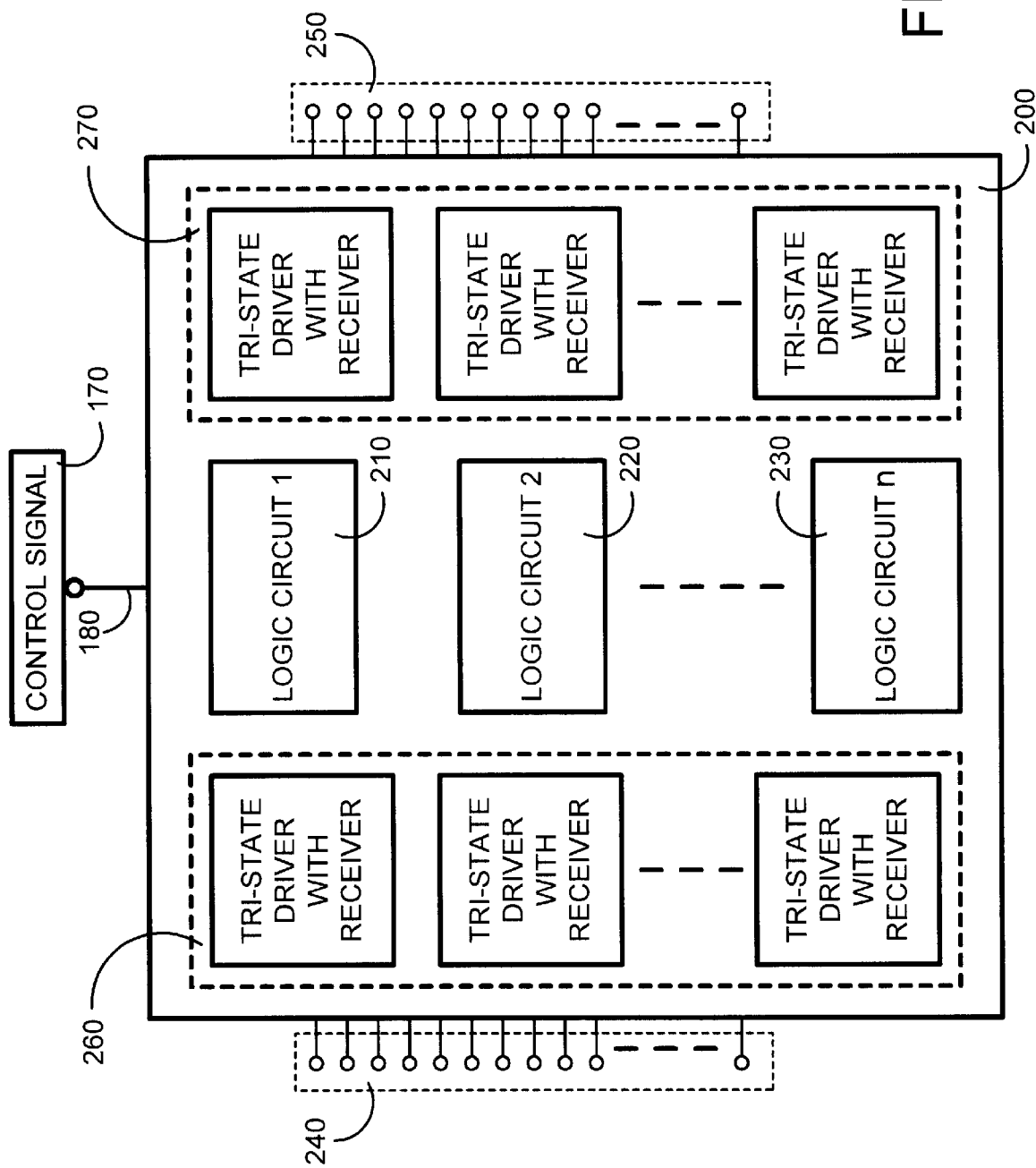
FIG. 2 is a general block diagram illustrating a microprocessor having a plurality of independent logic circuits in accordance with the present invention.

FIG. 1 illustrates the generic case where a microprocessor 100 is designed with two independent logic circuits, 110 and 120. However, a microprocessor designed in accordance with the present invention need not be limited to two independent logic circuits. Consequently, FIG. 2 illustrates an alternate embodiment of the present invention wherein a microprocessor 200 may have any number of independent logic circuits, 210, 220, and 230. Further, the microprocessor 200 can have any number of bidirectional input/output pins 240 and 250, such that the desired numbers of input and output pins are available to the logic circuits, 210, 220, and 230. Again, a series of latches or logic gates, such as, for example, a tri-state driver paired with a receiver device, or the equivalent, 260 or 270 are associated with each bidirectional pin.

Where more than two independent logic circuits are implemented within a single microprocessor, pairs of logic circuits preferably share the same input and output pins. One pair of logic circuits preferably uses these shared input and output pins, while other pairs of logic circuits preferably use other shared input and output pins. In other words, the generic case illustrated in FIG. 1, and described above, can be separately implemented a plurality of times on a single microprocessor. A single control signal 170, input via the control line 180 as described above, is preferably used to enable one circuit of a pair while disabling the other.

However, in a further embodiment, three or more circuits may share the same input and output pins by using additional control signals. Specifically, control signals input via separate control lines may be associated with each logic circuit to enable or disable specific logic circuits. Alternatively, the number of control lines may be reduced by using additional selection control logic to enable or disable one or more logic circuits simultaneously.

Figure 3:
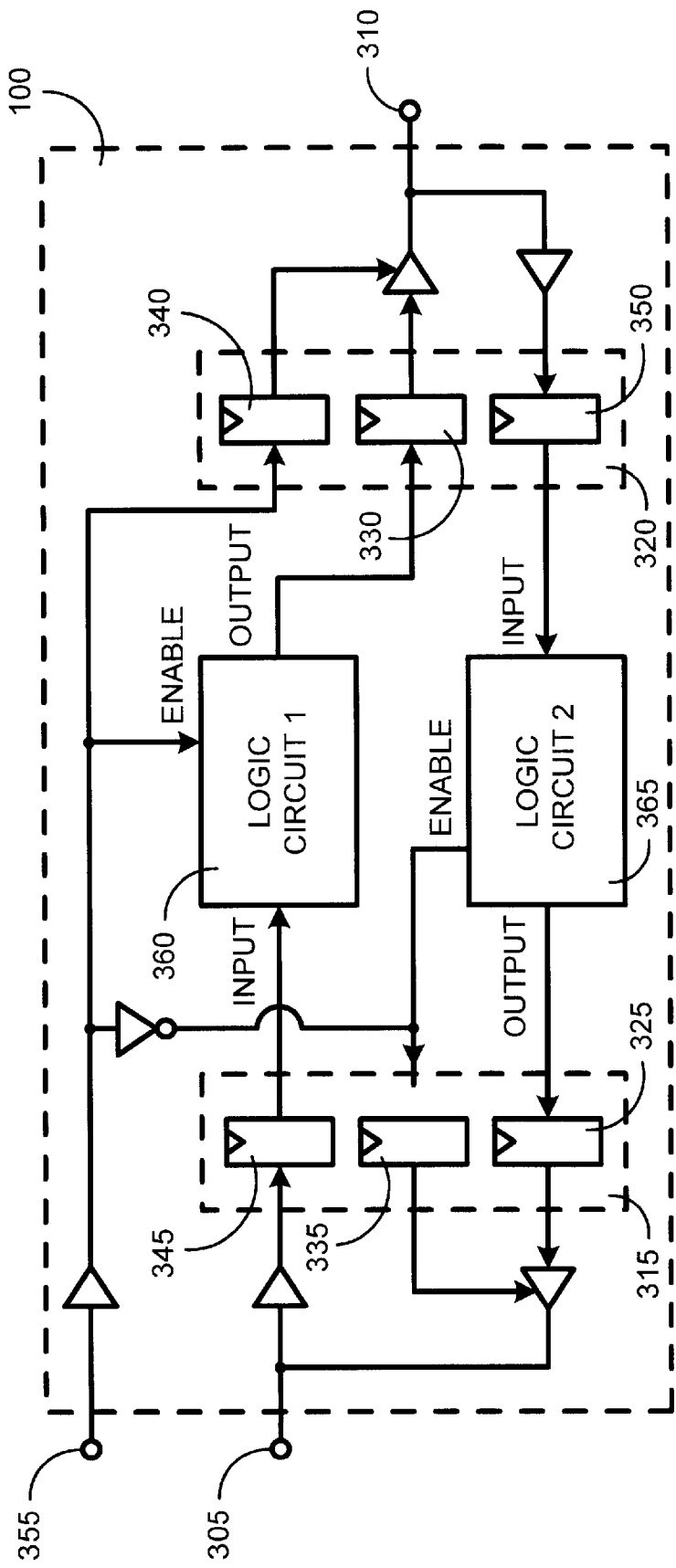
FIG. 3 is a general schematic diagram of the microprocessor of FIG. 1.

Operation:

FIG. 3 illustrates a general schematic diagram of the microprocessor 100 of FIG. 1. Each shared pin, 305 and 310, on the microprocessor 100 is preferably implemented as a bidirectional signal, using a series of latches or logic gates, such as, for example a tri-state driver paired with a receiver device, or the equivalent, 315 or 320. Each tri-state driver/receiver, 315 or 320, preferably has a boundary driver data latch, 325 or 330, a boundary driver enable latch, 335 or 340, and a boundary receiver latch, 345 or 350. The boundary receiver latches, 345 or 350, receive input from input/output pins 305 and 310.

A control signal is preferably input via a control pin 355 to an enable gate for the first logic circuit 360 to either enable or disable that logic circuit, depending upon whether the signal is a logical high or a logical low, as described above. In addition, the control signal is also input to the boundary driver enable latch 340 to either allow or prevent an output from the first logic circuit 360 to be sent to pin 310, again depending upon whether the signal is a logical high or low as described above. Further, the control signal is inverted and input to an enable gate for the second logic circuit 365 to either enable or disable that circuit, and to the boundary driver enable latch 335 to either allow or prevent an output from the second logic circuit 360 to be sent to pin 305.

Consequently, providing a logical high signal to the control pin 355 will provide a logical high to both the enable gate for the first logic circuit 360, and to the boundary driver enable latch 340. Inverting the logical signal produces a logical low signal. As a result, a logical low will be provided to both to the enable gate for the second circuit 365, and to the boundary driver enable latch 335. Therefore, a logical high signal input to the control pin 355 will enable the first circuit while disabling the second circuit, and causing pin 305 to act as an input pin for the first circuit and pin 310 to act as an output pin for the first circuit.

Similarly, providing a logical low signal to the control pin 355 will provide a logical low to both the enable gate for the first logic circuit 360, and to the boundary driver enable latch 340. Inverting the logical signal produces a logical high signal. As a result, a logical high will be provided to both to the enable gate for the second circuit 365, and to the boundary driver enable latch 335. Therefore, a logical low signal input to the control pin 355 will enable the second circuit 365 while disabling the first circuit 360, and causing pin 310 to act as an input pin for the second circuit and pin 305 to act as an output pin for the second circuit.

The concepts described above for a single input pin or output pin are preferably extended to the case where there are a plurality of input and/or output pins. Enabling or disabling of the first or second logic circuit, 360 or 365, is identical to the method described above for the single pin case. Further, as discussed previously, a series of latches or logic gates, such as, for example a tri-state driver paired with a receiver device, or the equivalent, is associated with each input/output pin. The enabling logic using tri-state drivers/receivers to allow pins to act as either inputs or outputs to specific circuits is also identical to the single pin case.

Specifically, a logical high control signal is input via the control pin 355 and sent directly to the enable latch of any number of tri-state drivers/receivers to enable the associated pins to act as output pins for the first logic circuit 360. Similarly, a logical high control signal input via the control pin 355 is inverted to send a logical low directly to the enable latch of any number of tri-state drivers/receivers to enable the associated pins to act as input pins for the first logic circuit 360.

Conversely, a logical low control signal is input via the control pin 355 and sent directly to the enable latch of any number of tri-state drivers/receivers to enable the associated pins to act as input pins for the second logic circuit 365. Similarly, a logical low control signal input via the control pin 355 is inverted to send a logical high directly to the enable latch of any number of tri-state drivers/receivers to enable the associated pins to act as output pins for the second logic circuit 360.

In an alternate embodiment, specific pins may be used solely for either functional inputs or for functional outputs for a specific logic circuit. Further this condition will exist with some number of pins in the case where separate logic circuits require different numbers of pins for input and/or output. For simplicity of design, a series of latches or logic gates, such as, for example a tri-state driver paired with a receiver device, or the equivalent, are still preferably associated with these pins. Consequently, pins are used only as functional inputs, the boundary driver data latch and the boundary driver enable latch associated with those pins are preferably tied inactive, while the output of the receiver latch is connected directly to the input for the logic circuit. Similarly, where pins are used only as functional outputs, the boundary driver data latch and the boundary driver enable latch associated with those pins are preferably driven by the output of the logic circuit while the output of the receiver latch is left unconnected.

Working Example:

The following description is for illustrative purposes only and describes a microprocessor design implemented in accordance with the present invention as applied to a dual-property microprocessor. It should be noted that although the following description involves a microprocessor having three logic circuits, two of which may be individually addressed in accordance with the present invention, any number of individually addressable logic circuits could be used as discussed previously.

Figure 4:
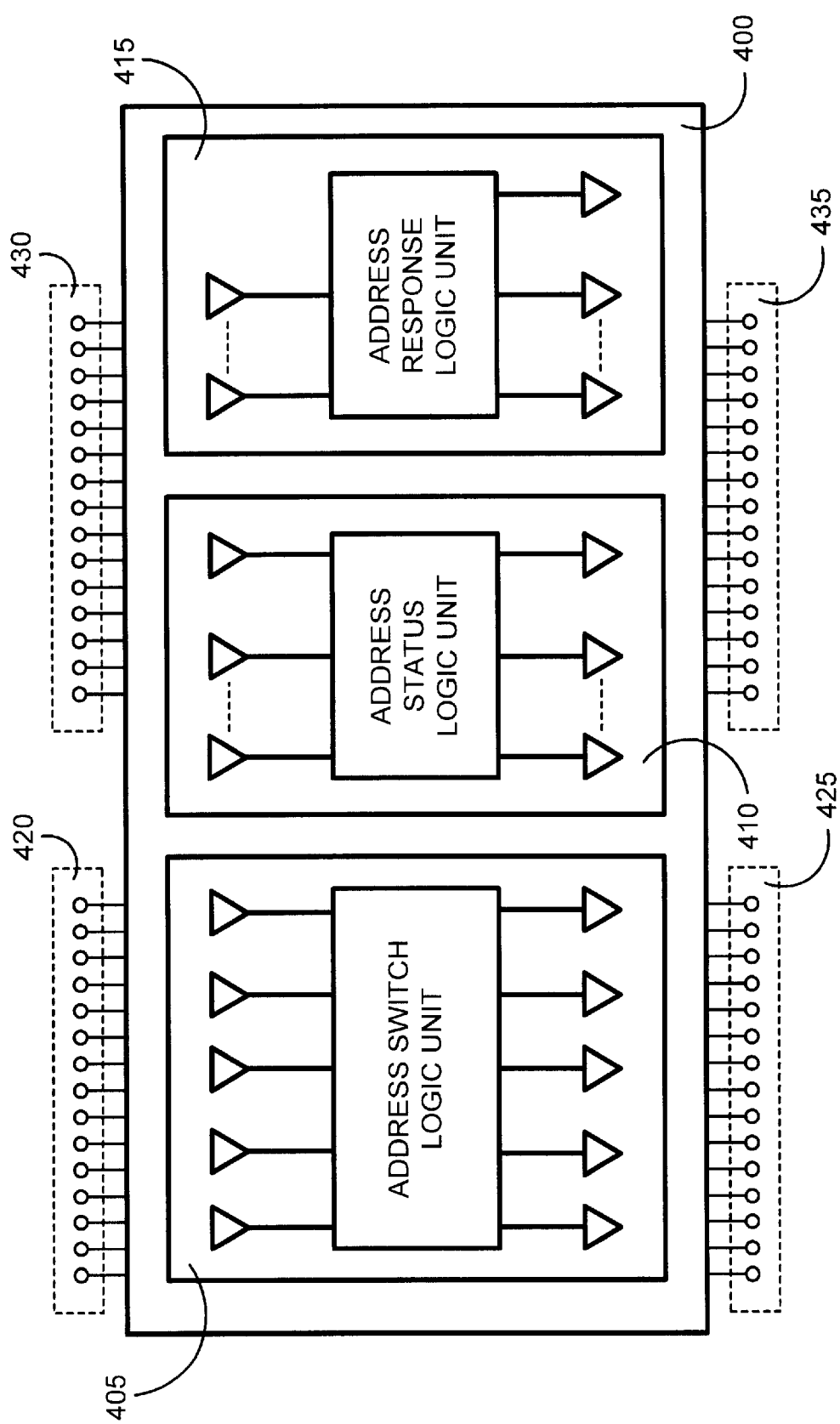
FIG. 4 is a general block diagram of a working example of a microprocessor in accordance with the present invention.

FIG. 4 is a general block diagram illustrating a dual-property microprocessor used in a working example of the present invention. Thus, FIG. 4 illustrates a microprocessor 400 for a memory subsystem having separate logic circuits providing an address switch (ASX) 405, an address status (AStat) 410, and an address response function (AResp) 415, respectively, for use in a multiprocessor computer system. A first set of pins 420 act as inputs for the ASX logic unit 405, while a second set of pins 425 act as outputs for the ASX logic unit. The first set of pins is not shared, as they are used solely for the ASX logic unit 405. A third set of pins 430 is shared between the AStat logic unit 410 and the AResp logic unit 415, and acts as either inputs for the AStat logic unit, or as outputs for the AResp logic unit. A forth set of pins 435 is also shared between the AStat logic unit 410 and the Aresp logic unit 415, and acts as either outputs to the AStat logic unit, or as inputs for the AResp logic unit.

In use, two instantiations of the microprocessor 400 are used in a single computer system. In both instantiations, the ASX logic unit 405 is active, as the ASX input and output pins are not shared. The address switch function of the microprocessor is bit-sliced between the two instantiations, with the most significant address bits being handled by the first instantiation, and the least significant address bits being handled by the second instantiation. Further, in the first instantiation, the AStat logic unit 410 is permanently enabled via a constant logical high control signal provided to a mode selection control pin, while the AResp logic unit 415 is disabled by inverting the control signal as described above. In the second instantiation, the AStat logic unit 415 is disabled via a constant logical low control signal provided to the mode selection control pin, while the AResp logic unit 415 is enabled by inverting the control signal as described above. Consequently, the microprocessor 400 contains both AStat and AResp logic units, but only one of these logic units is enabled per instantiation.

The AStat and AResp logic units, 410 and 415, are both pin-intensive functions. The AStat logic unit 410 receives forty-two 3-bit responses as inputs and generates forty-one 3-bit outputs, plus five miscellaneous outputs for a total of 254 pins. The AResp logic unit 415 receives forty 4-bit responses as inputs and generates forty-one 4-bit outputs, plus five miscellaneous outputs for a total of 329 pins. The microprocessor 400 is able to use the same 329 pins for both the AStat and AResp logic units, 410 and 415, without the addition of logical multiplexing within the microprocessor 400 by using a system and method in accordance with the present invention. Specifically, pins used as inputs for the AStat logic unit 410 are used as outputs for the AResp logic unit 415. Further, pins used as outputs for the AStat logic unit 410 are used as inputs for the AResp logic unit 415. Because the AResp logic unit 415 requires more pins than the AStat logic unit 410, some of the pins are used solely by the AResp logic unit. These pins are used only as functional inputs or functional outputs as described in detail above.

In accordance with the present invention, a microprocessor designed in accordance with the present invention can assume the desired characteristics by simply enabling one or more logic circuits while disabling other logic circuits that share pins with the enabled circuit. Allowing the use of two or more identical parts in a single system, any of which can take on the properties of the desired function, has several advantages. The use of a microprocessor designed in accordance with the present invention reduces system cost when compared to an equivalent implementation that uses two or more unique parts. Further, the use of a microprocessor designed in accordance with the present invention reduces component size when compared to an equivalent implementation that uses a single microprocessor without shared pins to implement multiple functions. In addition, the use of a microprocessor designed in accordance with the present invention and reduces microprocessor power consumption while improving microprocessor computational performance by eliminating the requirement to use multiplexing logic.

It will be understood from the foregoing description that various modifications and changes may be made in the preferred embodiment of the present invention without departing from its true spirit. It is intended that this description is for purposes of illustration only and should not be construed in a limiting sense. The scope of this invention should be limited only by the language of the following claims.

What is claimed is:

1. A method for implementing a plurality of logic circuits on a microprocessor, comprising:
   receiving a control signal;
   inverting the control signal;
   sharing connections from input and output pins between at least one of the logic circuits of the microprocessor;
   selectively connecting the input and output pins to at least one of the logic circuits in response to the control signal; and
   selectively disconnecting the input and output pins of at least another one of the logic circuits in response to the inverted control signal thereby enabling the microprocessor to assume predefined properties of the at least one of the logic circuits.

2. The method for sharing input and output pins claim 1 wherein logic circuits are selectively enabled by a control signal.

3. The method for sharing input and output pins of claim 2 wherein the control signal is inverted to disable logic circuits not enabled by the control signal.

4. The method for sharing input and output pins claim 1 wherein logic circuits are selectively disabled by a control signal.

5. The method for sharing input and output pins of claim 1 wherein each input or output pin is used by one enabled logic circuit at a time.

6. The method for sharing input and output pins of claim 1 wherein input or output pins are not addressable by disabled logic circuits.

7. The method for sharing input and output pins of claim 1 wherein the input and output pins are bidirectional, having the capability of acting as either inputs or outputs for at least one of the logic circuits.

8. The method for sharing input and output pins of claim 7 further comprising a plurality of latch devices for controlling whether each pin acts as an input pin or an output pin.

9. A system for implementing a plurality of logic functions on a microprocessor comprising:
   a control pin coupled to the microprocessor that receives a control signal;
   an inverter coupled to the control pin that inverts the control signal;
   a plurality of logic circuits that share connections of input and output pins of the microprocessor;
   a gate on each logic circuit that selectively connects the input and output pins of at least one of logic circuit in response to the control signal, and selectively disconnects the input and output pins of at least another one of the logic circuits in response to the inverted control signal to enable the microprocessor to assume predefined properties of the at least one of the logic circuits.

10. The system of claim 9 wherein the input and output pins are bidirectional, having the capability to act as either input pins or as output pins.

11. The system of claim 9 further comprising a plurality latch devices coupled to each input or output pin.

12. The system of claim 11 wherein specific latch devices have the capability to directly receive the control signal from the control pin.

13. The system of claim 11 wherein specific latch devices have the capability to receive an inverted control signal from the inverter.

14. The system of claim 11 wherein latch devices which receive a logical high control signal enable the input and output pins to act as input pins.

15. The system of claim 11 wherein latch devices which receive a logical low control signal enable the input and output pins to act as output pins.

16. The system of claim 11 wherein specific logic circuits of the plurality of logic circuits are coupled to the control pin.

17. The system of claim 16 wherein each logic circuit has the capability to be enabled by a logical high control signal input to the control pin.

18. The system of claim 16 wherein each logic circuit has the capability to be disabled by a logical low control signal input to the control pin.

19. The system of claim 11 wherein specific logic circuits of the plurality of logic circuits are coupled to the inverter.

20. The system of claim 19 wherein each logic circuit has the capability to be disabled by a logical high control signal input to the control pin.

21. A microprocessor having a plurality of separate logic circuits addressed by shared input and output connections, comprising:
   a plurality of control signals coupled to at least one control pin; and
   a plurality of latch devices coupled to each shared pin that selectively connects the input and output connections of at least one of logic circuit in response to one of the control signals, and selectively disconnects the input and output connections of at least another one of the logic circuits in response to another control signal so that the microprocessor assumes predefined properties of the at least one of the logic circuits.

22. The microprocessor of claim 21 further comprising an inverter coupled to at least one control pin that inverts at least one of the control signals.

23. The microprocessor of claim 22 wherein the inverter is coupled to specific predefined logic circuits.

24. The microprocessor of claim 23 wherein the inverter is coupled to the logic circuit and has the capability to enable the logic circuit with a logical low control signal input to the at least one control pin.

25. The microprocessor of claim 21 wherein the at least one control pin is coupled to specific predefined logic circuits.

26. The microprocessor of claim 25 wherein the at control pin is coupled to the logic circuit and has the capability to enable the logic circuit with a logical high control signal input to the at least one control pin.

* * * * *